United States Patent [19]

Takeuchi et al.

[11] Patent Number: 4,965,589
[45] Date of Patent: Oct. 23, 1990

[54] RECORDING HEAD HAVING SPACED-APART ELECTRODES

[75] Inventors: Yukihisa Takeuchi; Azuma Yamamoto, both of Nagoya, Japan

[73] Assignee: NGK Insulators, Ltd., Japan

[21] Appl. No.: 366,499

[22] Filed: Jun. 15, 1989

[30] Foreign Application Priority Data

Jun. 17, 1988 [JP] Japan .................................. 63-150885
Jul. 8, 1988 [JP] Japan .................................. 63-171100
Apr. 27, 1989 [JP] Japan .................................. 1-108091

[51] Int. Cl.⁵ .......................................... G01D 15/10
[52] U.S. Cl. .................................. 346/76 PH; 219/216
[58] Field of Search ............ 346/76 PH; 219/216 PH

[56] References Cited

FOREIGN PATENT DOCUMENTS

| 58-12790 | 1/1983 | Japan . | |
|---|---|---|---|
| 58-104787 | 6/1983 | Japan . | |
| 60-78772 | 5/1985 | Japan . | |
| 61-37493 | 2/1986 | Japan . | |
| 61-171349 | 8/1986 | Japan . | |
| 61-230966 | 10/1986 | Japan . | |
| 61-272172 | 12/1986 | Japan . | |
| 0161555 | 7/1987 | Japan ........................... | 346/76 PH |
| 63-30279 | 2/1988 | Japan . | |
| 63-51152 | 3/1988 | Japan . | |
| 63-87264 | 4/1988 | Japan . | |
| 63-160855 | 7/1988 | Japan . | |

Primary Examiner—Bruce A. Reynolds
Assistant Examiner—Huan Tran
Attorney, Agent, or Firm—Arnold, White & Durkee

[57] ABSTRACT

A recording head capable of applying an electric current, including an array of recording electrodes in the form of strips which are substantially equally spaced apart from each other in a direction perpendicular to lengths of the strips, by a distance smaller than the thickness of said strips. The strips include at least parts of generally elongate electrode portions of electrically conductive sheets superposed on each other in a predetermined relative position into an electrode assembly. The elongate electrode portions of each electrically conductive sheet is defined by a plurality of apertures whose width is larger than the thickness of each electrically conductive sheet. The elongate electrode portions of electrically conductive sheets cooperate with each other to define a plurality of slits whose width is smaller than the thickness of the sheet. The electrode portions of the electrode assembly functioning as the strips are spaced apart from each other by the width of the slits.

13 Claims, 7 Drawing Sheets

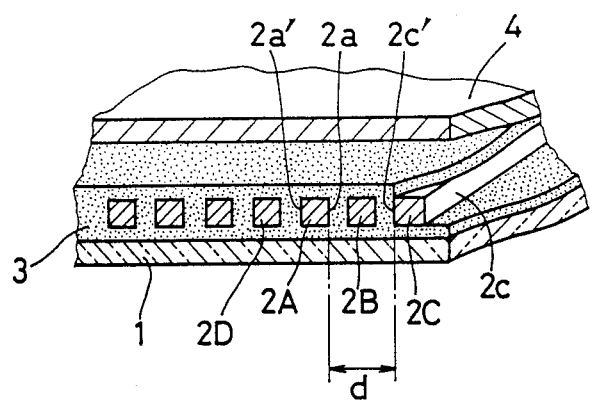

RECORDING HEAD HAVING SPACED-APART ELECTRODES

BACKGROUND OF THE INVENTION

1. Field of the Invention

The present invention relates generally to a recording head for recording or printing images such as characters, figures, or other patterns, by applying an electric current to a ribbon or film, or to a recording medium. More particularly, the invention is concerned with a structure of recording electrodes used for such an electrothermal recording head, electrical discharge recording head or electrostatic recording head.

2. Discussion of the Prior Art

Various structures or arrangements of recording electrodes have been proposed for recording heads, for applying an electric current to effect a recording operation, by using a recording medium of electrical discharge destruction type, a recording medium having heat-sensitive color former, or a recording medium such as a thermosensitive paper, or by using a ribbon or film which has at least an electrically resistive layer. Examples of such recording heads are disclosed in laid-open Publication Nos. 61-171349, 61-272172, 60-78772, 63-51152, 63-87264, and 61-23,0966 of unexamined Japanese Patent Applications. These recording heads are operated such that a plurality of recording electrodes are held in contact with a ribbon or film to apply electric currents to local portions of its electrically resistive layer, so as to produce heat for printing on a recording medium, or such that the electrodes are held in contact with a recording medium having a vapor-deposited aluminum layer, a black-colored layer and a base layer, to remove local portions of the aluminum layer by electric discharge destruction, so as to expose the corresponding local portions of the black-colored layer.

Further, laid-open Publication Nos. 58-12790, 58-104787, 61-37493, 63-3027,9 and 63-160855 of unexamined Japanese Patent Applications disclose recording heads for applying an electric current to an ink layer or a heat-sensitive layer which is formed on the surface of a sheet, ribbon, web or other film-like member, or which forms an inner layer of the film-like member. The ink layer may be an electrically conductive layer, an electrically resistive layer or electrochemical reaction layer. The heat-sensitive layer may contain an electrolyte and produces a color due to exposure to heat.

The recording electrodes used for such recording heads must be formed with high accuracy, to assure high degrees of uniformity and reproducibility of images printed in a matrix of dots. For improved resolution of the printed images, the recording head must have a high density of electrodes, namely, a sufficiently large number of electrodes per unit distance in the direction in which the electrodes are arranged in mutually spaced-apart relation. For increased recording speed and enhanced recording quality, the electrodes must have a sufficiently large thickness, and the spacing between the adjacent electrodes must be sufficiently short.

Laid-open Publication No. 61-171349 discloses a method of preparing an array of recording electrodes, in which electrically conductive wires or needles are arranged and fixed on a suitable support member. However, this method does not permit the wires or needles to be suitably disposed with high efficiency. Where the required number of electrodes is relatively large, the method is substantially impracticable from the standpoints of production technique and economy. Further, the method does not permit the electrodes to be arranged in spaced-apart relation at a pitch small enough to assure desired quality of printed images.

There are also known methods which utilize photolithography to form the recording electrodes. In this method, an electrically conductive layer is initially formed on an electrically insulating substrate, in a suitable process, such as thin-film forming method by plating or sputtering on the substrate, thick-film forming method by applying a coating of a suitable paste or resinate to the substrate, or bonding of an electrically conductive sheet to the substrate. The formed electrically conductive layer is photolithographically patterned to produce a desired array of the recording electrodes. These methods permit a comparatively large number of the electrodes to be easily formed with relatively high density and accuracy, and are therefore widely practiced in the art. However, the lithographic methods do not permit the electrically conductive layer or the electrodes to have a thickness which is larger than the spacing between the adjacent electrodes. Thus, the recording heads using the electrodes prepared by the methods in question are not satisfactory in terms of the recording speed and quality of printed images.

Also known is a method which uses a press forming machine, to pierce an electrically conductive sheet such that apertures or cutouts are formed through the sheet so as to define suitably arranged electrodes. This method is limited in the minimum width of the apertures, and the thickness of the electrodes (thickness of the sheet) cannot be greater than the spacing of the electrodes. The recording heads using the electrodes prepared according to this method are not satisfactory in terms of the recording speed and quality of printed images.

SUMMARY OF THE INVENTION

The present invention was made to solve the problems or drawbacks encountered in the prior art as described above. It is accordingly an object of the present invention to provide a recording head operable to apply an electric current, which has an array of accurately formed and positioned recording electrodes arranged with high density per unit distance, thereby permitting an efficient recording operation with improved quality of recorded images.

The above object may be achieved according to the principle of the present invention, which provides a recording head operable to apply an electric current, comprising an array of recording electrodes in the form of strips which are substantially equally or regularly spaced apart from each other in a direction perpendicular to lengths of the strips, by a distance smaller than a thickness of the strips. The strips consist of at least parts of generally elongate electrode portions of a plurality of electrically conductive sheets superposed on each other in a predetermined relative position into an electrode assembly. The elongate electrode portions of each of the electrically conductive sheets is defined by a plurality of apertures whose width is larger than a thickness of. The each electrically conductive sheet, the elongate electrode portions of the plurality of electrically conductive sheets cooperate with each other to define a plurality of slits whose width is smaller than the thickness of the each electrically conductive sheet, the electrode portions of the electrode assembly as the strips being spaced apart from each other by the width of the plurality of slits.

The present invention has made it possible to form the recording electrodes whose thickness is larger than the distance by which the electrodes are spaced apart from each other. This is not possible according to the conventional photolithographically formed pattern of electrodes. More specifically, the two or more electrically conductive sheets are suitably patterned so as to cooperate with each other to define a desired array of recording electrodes. Namely, a plurality of apertures having a width larger than the thickness of the sheets are formed through each of the conductive sheets, such that the apertures in each sheet define a plurality of electrode portions so that the electrode portions of the plurality of sheets cooperate with each other to form the array of recording electrodes when the sheets are superposed on each other and accurately positioned relative to each other in a predetermined positional relationship. Accordingly the adjacent electrode portions (i.e., electrodes in the form of strips) of the different sheets define a slit by which the electrode portions are spaced from each other. That is, the spacing between the adjacent electrode portions of the electrode assembly, i.e, the spacing between the recording electrodes is equal to the width of the slit, which is smaller than the thickness of the sheets.

The use of the electrically conductive sheets having the same thickness constructed as described above provides a pattern of electrode portions which are spaced from each other by a sufficiently small distance by the appropriately positioned slits which have an accordingly small width. The electrode assembly having the pattern of electrode portions is suitably processed to provide an array of recording electrodes in the form of strips. Thus, the recording electrodes have a uniform thickness larger than its spacing, and sufficiently high density per unit distance in the direction of width. Further, the electrodes are accurately shaped and positioned relative to each other, and are suitably adapted for electrical contact with a subject to which an electric current is applied.

For assuring accurate positioning of the two or more electrically conductive sheets, it is desirable to provide at least one of the sheets with a plurality of thin-walled portions, at which the sheets contact each other for relative alignment of the sheets. This arrangement is preferred where the recording head requires extremely high accuracy of spacing pitch and spacing distance of the recording electrodes.

For reduced wear of the recording electrodes due to its contact with an inking material or a recording medium, the electrically conductive sheets are made of an electrically conductive material which has high wear resistance. For example, a major component of the conductive material preferably consists of a metal such as chromium, titanium, molybdenum and tungsten, or an alloy or a compound thereof. More preferably, the sheets are made of an electrically conductive material whose major component consists of a chromium metal, alloy or compound, since chromium has high resistance to mechanical wear, and is less likely to be consumed due to electric activities. In particular, it is desirable to use a three-component alloy or compound containing chromium such as an alloy or compound which contains molybdenum, chromium and nitrogen.

The array of recording electrodes of the present recording head is carried or supported by a substrate which is preferably formed of a material having relatively low wear resistance, particularly, a ceramic material which has a relatively high heat resistance, a hardness lower than that of the material of the electrodes, and which is easily worn. More preferably, the substrate consists of a sheet of integrated or foliated mica, or is formed of a glass ceramic material which contains mica or boron nitride and has a high degree of machinability.

According to the present invention as described above, the electrically conductive sheets to be superposed on each other into the electrode assembly have the apertures whose width is larger than the thickness of the sheets. To reduce the number of the electrically conductive sheets required to prepare the electrode assembly, it is desirable that the apertures be equally spaced apart from each other in the direction of width.

To assure high positioning or spacing accuracy of the recording electrodes, the electrically conductive sheets are preferably provided with suitable means for positioning the electrode portions. For instance, the sheets are provided with thin-walled portions which are spaced from each other at the same pitch as the apertures (whose width is larger than the thickness of the sheets). Alternatively, the electrode portions of one of the two electrically conductive sheets engage the apertures of the other sheet, as indicated in FIG. 8(e). While the thin-walled portions may be formed by a suitable known method, it is desirable to form these portions by etching the sheets, by various known methods such as wet etching or dry etching. The desired thickness of the thin-walled portions may be established by suitably selecting the etching conditions in which the sheets are etched through a suitable etching mask for protecting the other portions of the sheets.

The apertures of the electrically conductive sheets may be formed by various known methods such as cutting, piercing by a press or other mechanical methods, or by using ultrasonic waves or laser. For avoiding or minimizing deformation or strain of the sheets due to stresses during the mechanical operation to form the apertures, it is preferable to form the apertures by etching. For the same reason, an etching process is preferred to the mechanical processes, for processing the electrode assembly to obtain the recording electrodes in the form of strips, from the electrode portions of the electrically conductive sheets. Obviously, the method to form the apertures or process the electrode portions is not limited to the etching process.

To prepare the recording head, the processed electrode assembly is bonded to the substrate by an adhesive material, for example. In this case, the adhesive material may be an inorganic adhesive, or a resin having high heat resistance such as epoxy, phenol and polyimide, or may be a mixture of a resin and an inorganic adhesive such as alumina, silica and boron nitride. Further, the bonding may be effected at an elevated temperature by using a soldering material or a glass material. It is also possible to use suitable jigs, fixtures or other mechanical means for fixing the processed electrode assembly to the substrate, under pressure.

The present invention may also be defined as a recording head comprising an array of generally elongate recording electrodes which are substantially equally spaced apart from each other in a direction perpendicular to lengths thereof, each of the recording electrodes having etched faces which are opposed to the two adjacent electrodes. Each of the etched faces of each electrode has a shape which is characteristic to etching of an aperture having a width equal to a spacing between that each etched face, and the nearer etched face of the electrode which is located next beyond the electrode immediately opposed to the relevant each etched face.

In the above case, the above-indicated aperture may be etched through one of the two electrically conductive sheets from which the relevant electrode and the electrode having the above-indicated nearer etched face are formed, while the electrode immediately opposed to the relevant each etched face may be formed from the other of the two electrically conductive sheets which has two adjacent apertures which are etched therethrough so as to define the etched faces of the electrode immediately opposed to the relevant each etched face. Each of the two adjacent apertures has the same width as the aperture of the above-indicated one sheet.

The two electrically conductive sheets may be superposed on each other into an electrode assembly wherein each of the two electrically conductive sheets has a plurality of generally elongate electrode portions which are substantially equally spaced from each other by the apertures, by a distance equal to the above-indicated width. In this instance, the recording electrodes consist of at least parts of the electrode portions of the two electrically conductive sheets. The two conductive sheets are positioned relative to each other such that each of the electrode portions of the one electrically conductive sheet is located intermediate between the opposite ends of a corresponding one of the apertures formed in the above-indicated other electrically conductive sheet.

BRIEF DESCRIPTION OF THE DRAWINGS

The above and optional objects, features and advantages of the present invention will be better understood by reading the following detailed description of the presently preferred embodiments of the invention, when considered in connection with the accompanying drawings, in which:

FIG. 10 is a fragmentary schematic perspective view illustrating a relationship between the opposite faces of each electrode and an etched aperture formed in each electrically conductive sheet.

DETAILED DESCRIPTION OF THE PREFERRED EMBODIMENTS

While the presently preferred embodiments of the invention will be described in detail by reference to the accompanying drawings to further clarify the concept of the present invention, it is to be understood that the invention is not confined to the details of these illustrated embodiments.

It is further to be understood that the invention may be embodied with various changes, modifications and improvements, which are not limited or bound by the illustrated embodiments and the foregoing description, and which may occur to those skilled in the art, without departing from the spirit and scope of the invention.

Figure 1:
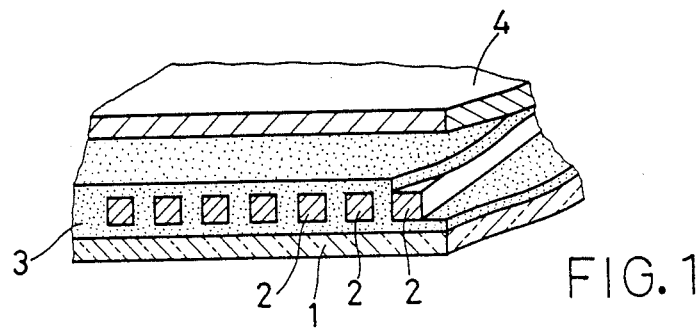
FIG. 1 is a fragmentary schematic view in perspective of an end portion of an electrothermal recording head according to one embodiment of the invention.

Referring first to the schematic view of FIG. 1, there is illustrated the end portion of the electrothermal recording head adapted to effect a recording or printing operation by applying an electric current or voltage to recording electrodes. The recording head uses a glass ceramic substrate formed of a glass ceramic material which contains mica and has a high degree of machinability. The recording head has an array of recording electrodes in the form of elongate strips 2 which are formed from stainless steel sheets. The elongate strips 2 are equally spaced apart from each other in a direction perpendicular to their length, such that the strips 2 lie in substantially the same plane parallel to the above direction. The array consists of 272 electrodes 2 which are arranged in the above-indicated direction, at a pitch of 125 microns (with a center-to-center spacing of 125 microns between the adjacent electrodes). Each of the electrodes 2 has a width of 100 microns and a thickness of 100 microns. The electrode array 2 is embedded within the thickness of an adhesive layer 3, which is interposed between the glass ceramic substrate 1 and a holder layer 4 made of alumina. Namely, the recording head is constructed such that the electrode array 2 is fixed by the adhesive layer 3 between the substrate 1 and the holder layer 4. It is noted that the holder layer 4 is preferably formed of a highly machinable glass ceramic material as used for the substrate 1.

Figure 9:
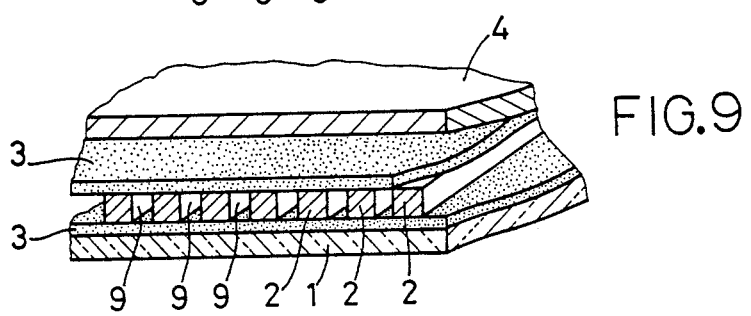
FIG. 9 is a fragmentary schematic view in perspective of an end portion of the recording head according to a yet further embodiment of the invention.

Another form of the recording head of the present invention is illustrated in the schematic view of FIG. 9. While the masses of the adhesive layer 3 fill the elongate spacings between the adjacent electrodes 2 in the recording head of FIG. 1, the corresponding elongate spacings in the recording head of FIG. 9 are left as elongate voids 9 that are not filled with the adhesive material 3. These voids 9 are utilized as channels for feeding a suitable recording or printing ink material to the recording end face of the recording head, and effect recording on a recording medium such as papers. The ink material may be an electrically conductive ink, an electrically resistive ink, or a color-producing ink which contains an electrolyte. Thus, the recording head of FIG. 9 which incorporates an ink supply means does not use a separate inking medium in the form of an ink ribbon, sheet, film or web.

Figure 2A:
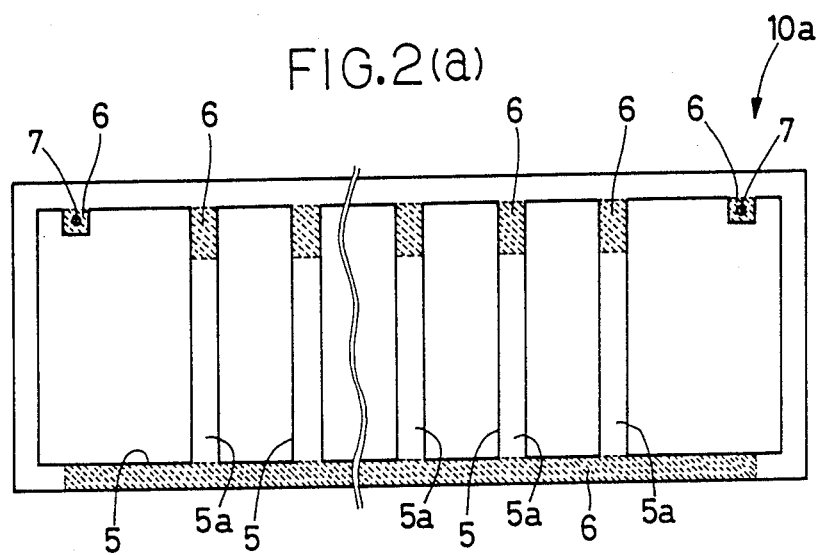
FIGS. 2(a) and 2(b) are explanatory plan views of two electrically conductive sheets used for the manufacture of recording electrodes incorporated in the recording head of FIG. 1.
Figure 2B:
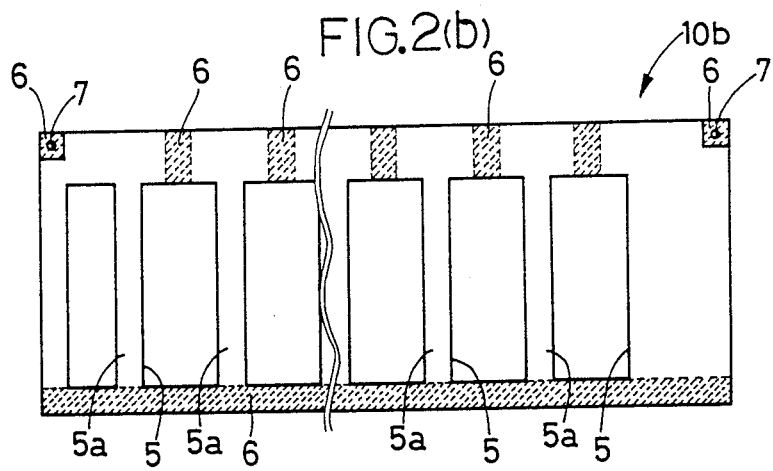
Figure 3:
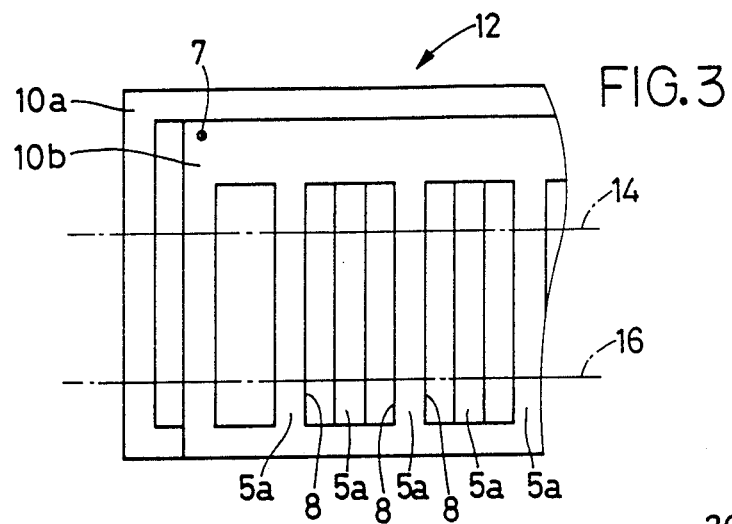
FIG. 3 is an explanatory plan view of an electrode assembly prepared by superposing the two conductive sheets of FIGS. 2(a) and 2(b) on each other.

Referring next to FIGS. 2(a), 2(b) and 3, there is illustrated process steps for fabricating the recording heads of FIGS. 1 and 9. Initially, two electrically conductive sheets in the form of stainless steel sheets 10a, 10b shown in FIGS. 2(a) and 2(b) are prepared. Each stainless steel sheet 10a, 10b has a plurality of rectangular apertures 5 which are equally spaced apart from each other in the direction perpendicular to their length, so as to define a plurality of equally spaced-apart electrode portions 5a. Each stainless steel sheet 10a, 10b further has a plurality of thin-walled portions 6. These two sheets 10a, 10b are superposed on each other as described below. The sheets 10a, 10b have a thickness of 100 microns, and each aperture 5 has a width of 150 microns. The apertures 5 are spaced apart from each other at a pitch of 250 microns. The thin-walled portions 6 have a thickness of 50 microns and a width of 100 microns, and are equally spaced apart from each other at a pitch of 250 microns.

The apertures 5 and the thin-walled portions 6 are formed by a suitable etching technique such that the apertures 5 are formed through the stainless steel sheets 10a, 10b, while the thin-walled portions 6 are formed by removing a portion of the thickness at the appropriate areas of the sheets, by suitably determining the etching conditions. Two of the thin-walled portions 6 of the sheets 10a, 10b have respective registration holes 7 formed therethrough. If necessary, these holes 7 are used for relative alignment or registration of the two sheets 10a, 10b when they are superposed on each other.

As shown in FIG. 3, the two electrically conductive stainless sheets 10a, 10b are superposed on each other into an electrode assembly 12, such that the thin-walled portions 6 of the two sheets are superposed on each other in mutually aligned or overlapping relationship, in order to assure the predetermined relative position of the two sheets 10a, 10b. The registration holes 7 may be used to accurately align the thin-walled portions 6 of the two sheets. In the thus prepared electrode assembly 12, a plurality of mutually spaced-apart, elongate rectangular parallel slits 8 are defined by the electrode portions 5a of the two stainless sheets 10a, 10b. Each slit 8 has a width which is smaller than the thickness of the stainless sheet 10a, 10b. In the present electrode assembly 12 wherein the thin-walled portions 6 of the two sheets 10a, 10b are superposed on each other, the total thickness of the superposed portions 6 is substantially 100 microns, i.e., equal to the thickness of each sheet 10a, 10b.

The electrode assembly 12 of FIG. 3 is bonded to the glass ceramic substrate 1 by means of the adhesive material 3 (adhesive layer 3), and the assembly 12 is cut or snapped off along parallel straight lines indicated by one-dot chain lines at 14 and 16 in FIG. 3, by a suitable method. Thus, a part of the length of the electrode portions 5a defined by the cutting lines 14, 16 is used as the elongate electrode strips 2. The obtained article is further processed to produce the recording head of FIG. 1 or 9.

Figure 4A:
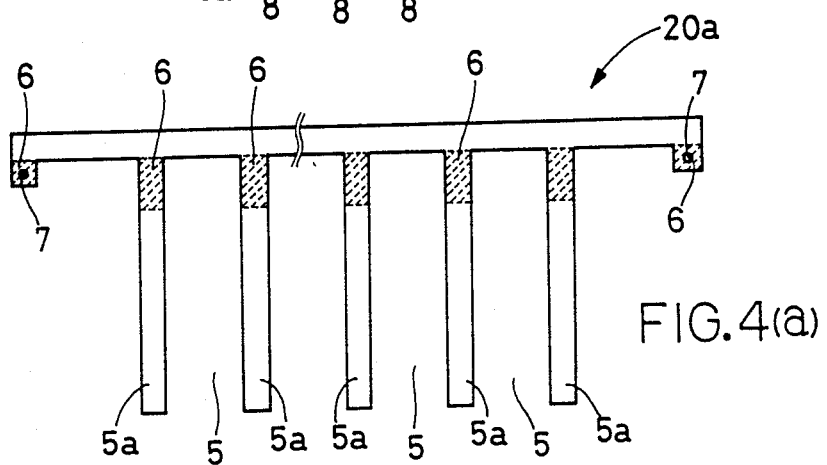
FIGS. 4(a) and 4(b) are plan views explaining modified forms of the electrically conductive sheets used for the recording electrodes of the recording head according to another embodiment of the invention.
Figure 4B:
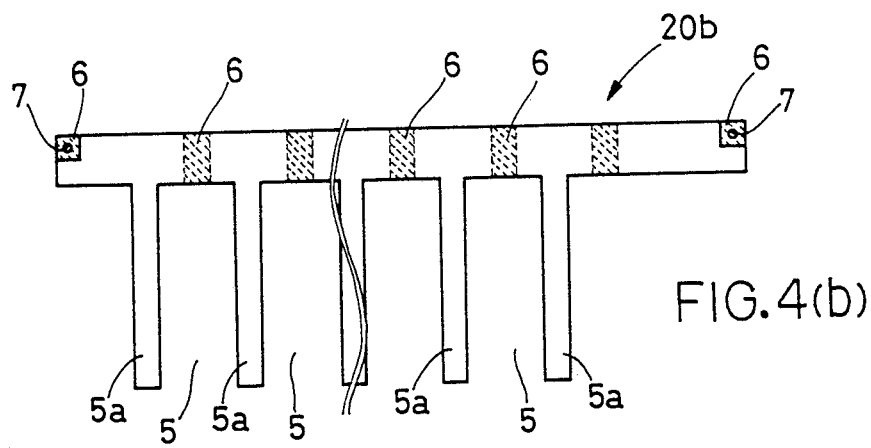
Figure 5:
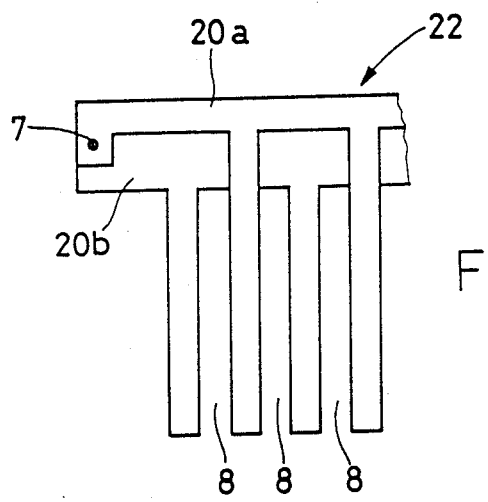
FIG. 5 is a fragmentary plan view of an electrode assembly prepared by superposing the two conductive sheets of FIGS. 4(a) and 4(b) on each other.

Referring to FIGS. 4(a) and 4(b), modified forms of the electrically conductive stainless steel sheets are indicated generally at 20a, 20b, which are substituted for the stainless steel sheets 10a, 10b of the preceding embodiment of FIGS. 2(a), 2(b). Unlike the stainless steel sheets 10a, 10b, the stainless steel sheets 20a, 20b do not have a rectangular peripheral frame, and each of the elongate rectangular apertures 5 is open at one of its short sides. However, the thickness of the stainless steel sheets 20a, 20b, the width and pitch of the apertures 5, the thickness, width and pitch of the thin-walled portions 6 are the same as those of the stainless steel sheets 10a, 10b shown in FIGS. 2(a) and 2(b). The apertures 5 and thin-walled portions 6 are formed by etching the sheets 20a, 20b in the same manner as used in the preceding embodiment. These two sheets 20a, 20b are superposed on each other, with the registration holes 7 of the two sheets aligned with each other. As a result, an electrode assembly 22 as shown in FIG. 5 is prepared. This assembly 22 is processed in the same manner as in the preceding embodiment, whereby the recording head of FIG. 1 or 9 is produced.

In the above embodiments, the thin-walled portions 6 locally formed on the electrically conductive sheets 10a, 10b, 20a, 20b as by an etching technique are effective to establish accurate relative positional relationship between the conductive sheets 10a and 10b, or 20a and 20b when the sheets are superposed on each other into the electrode assembly 12, 22. While the thin-walled portions may be provided on only one of the two or more electrically conductive sheets, it is preferred to provide the thin-walled portions on all of the electrically conductive sheets that are to be assembled together. In this case, the total thickness of the thin-walled portions of the superposed sheets can be advantageously made substantially or almost equal to the nominal thickness of each sheet (thickness of the other portions of the sheet), so that the superposed thin-walled portions and the electrode portions of the electrode assembly (12, 22) can lie substantially in the same plane.

Referring to FIGS. 6(a) through 6(d) and FIGS. 7(a) through 7(c), a further embodiment of the invention will be described. In these embodiments, thin-walled portions of each electrically conductive sheet have different thicknesses, as described below.

Figures 6A, 6B:
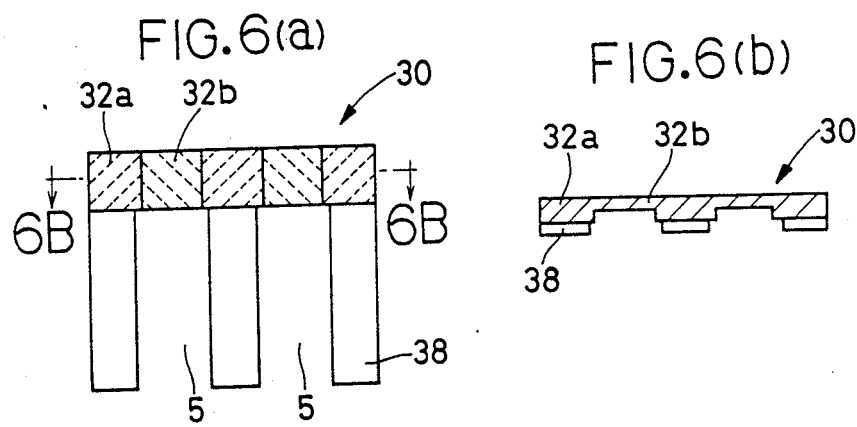
FIGS. 6(a) and 6(c) are explanatory plan views showing further modified forms of the two electrically conductive sheets according to a further embodiment of the invention.
FIGS. 6(b)) and 6(d) are elevational views in cross section taken along line B—B of FIG. 6(a) and line D—D FIG. 6(c), respectively.
Figures 6C, 6D:
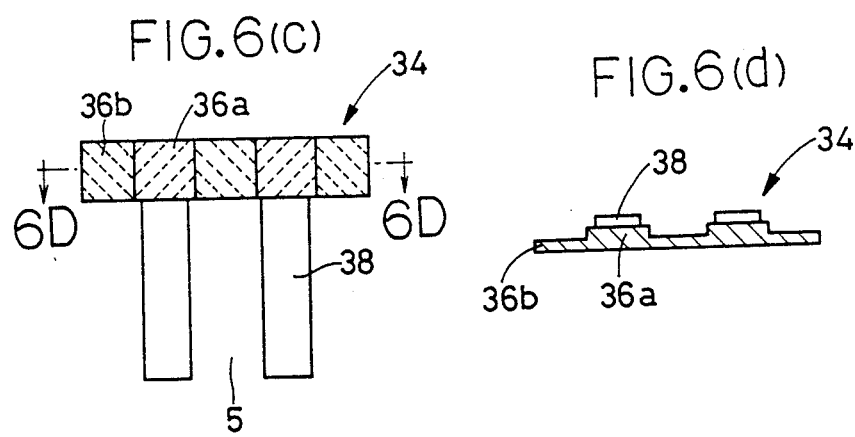
Figure 7A:
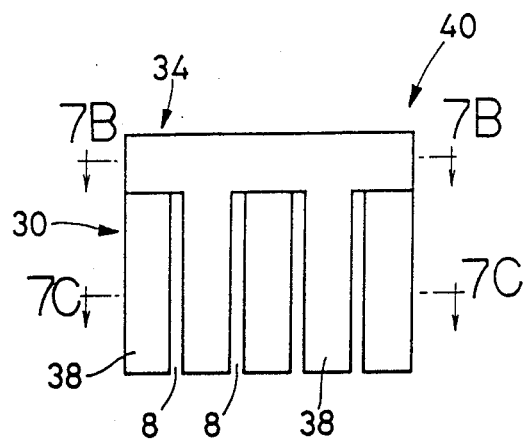
FIG. 7(a) is an explanatory plan view of an electrode assembly prepared by superposing the two conductive sheets of FIGS. 6(a)–6(d) on each other.
Figure 7B:
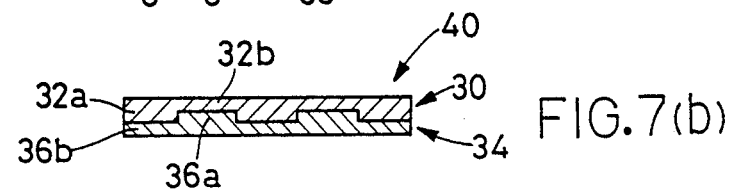
FIGS. 7(b) and 7(c) are cross sectional views taken along lines B—B and C—C of FIG. 7(a)
Figure 7C:
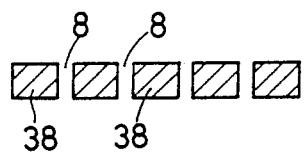

In this modified embodiment, an electrically conductive sheet in the form of a stainless steel sheet 30 as shown in FIG. 6(a) has first thin-walled portions 32a, and second thin-walled portions 32b, as shown in FIG. 6(b). These thin-walled portions 32a, 32b are formed by etching the respective portions of the sheet 30. The first thin-walled portions 32a have a thickness which is two thirds ($t$) of the thickness of the nominal thickness of the sheet 30, i.e., two thirds of the thickness of elongate electrode portions 38 defined by the elongate rectangular apertures 5. On the other hand, the second thin-walled portions 32b have a thickness which is one third of the thickness of the electrode portions 38. Another stainless steel sheet on which the sheet 30 is superposed is indicated generally at 34 in FIGS. 6(c) and 6(d). This electrically conductive stainless steel sheet 34 also has first thin-walled portions 36a and second thin-walled portions 36b, which are formed by etching of the sheet. The first and second thin-walled protions 36a, 36b have the same widths as the first and second thin-walled portions 32a, 32b. These two stainless steel sheets 30, 34 are superposed on each other, as indicated in FIGS.

7(a), 7(b) and 7(c), such that the first thin-walled portions 32a of the sheet 30 are held in contact with the second thin-walled portions 36b of the sheet 34, while the second thin-walled portions 32b of the sheet 30 are held in contact with the first thin-walled portions 36a. Thus, an electrode assembly 10 is prepared from the two stainless steel sheets 30, 34.

Since the first and second thin-walled portions 32a, 36a and 32b, 36b of the stainless sheets 30, 34 have the different thicknesses as described above, the two sheets 30, 34 of the electrode assembly 40 can be readily positioned and aligned relative to each other, with high accuracy, without increasing the thickness of the electrode assembly 40 at its superposed portions (32a, 32b, 36a, 36b).

Figure 8A:
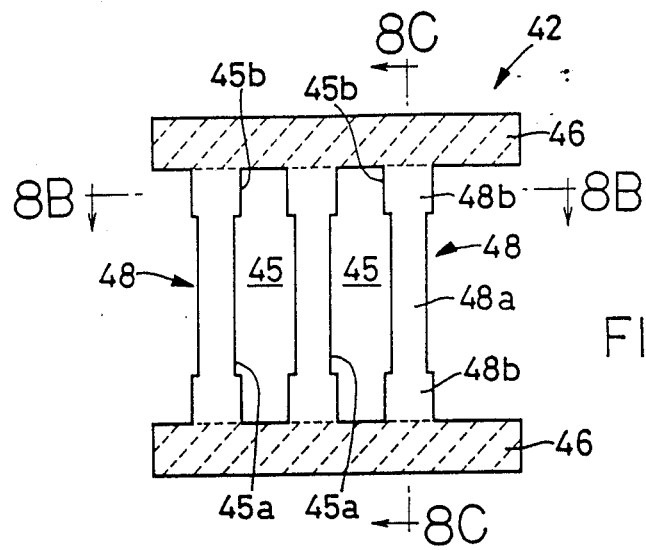
FIGS. 8(a) and 8(d) are explanatory plan views of still further forms of the electrically conductive sheets according to still a further embodiment of the invention.
Figures 8B, 8C:
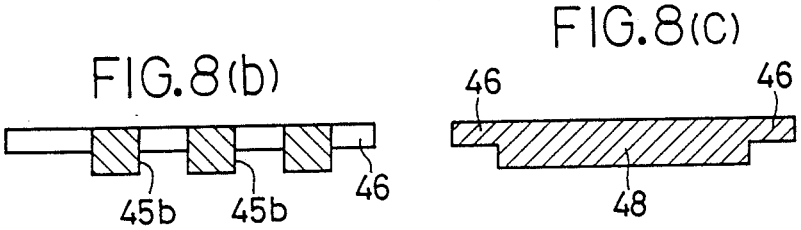
FIGS. 8(b) and 8(c) are cross sectional views taken along lines B—B and C—C of FIG. 8(a), respectively.
Figure 8D:
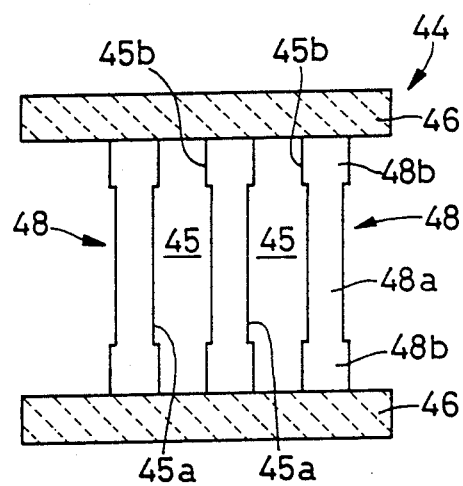
Figure 8E:
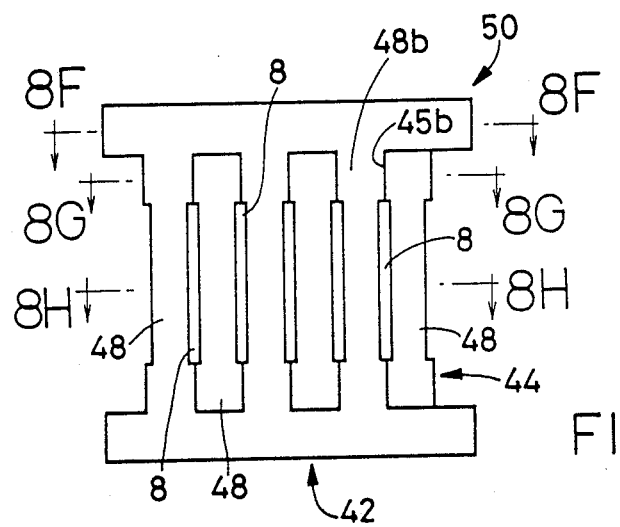
FIG. 8(e) is an explanatory plan view showing an electrode assembly prepared by superposing the two conductive sheets of FIGS. 8(a)–8(d) on each other.
Figure 8F:
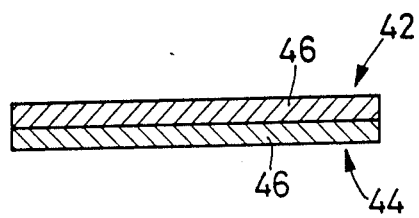
FIGS. 8(f), 8(g) and 8(h) are cross sectional views taken along lines F—F, G—G and H—H of FIG. 8(e), respectively.
Figure 8G:
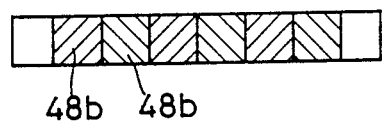
Figure 8H:
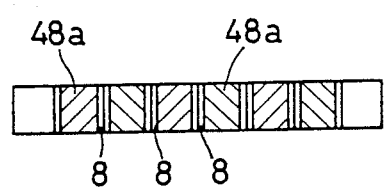

A still further modified embodiment of the invention is illustrated in FIGS. 8(a) through 8(h), wherein each of two stainless steel sheets 42, 44 as electrically conductive sheets has mutually spaced-apart apertures 45, each of which have length portions which have different widths. Described more specifically, the apertures 45 and thin-walled portions 46 are formed in each stainless steel sheet 42, 44, by an etching operation, as in the preceding embodiments. Each aperture 45 has a relatively wide central portion 45a, and relatively narrow opposite end portions 45b, 45b on both sides of the central portion 45a. The ends of the opposite end portions 45b are defined by the thin-walled portions 46. As a result, the apertures 45 define a plurality of mutually spaced-apart, generally elongate electrode portions 48, each of which has a relatively narrow central portion 48a, and relatively wide opposite end portions 48b, 48b which terminate in the thin-walled portions 46. The width of the relatively narrow end portions 45b of the aperture 45 is made equal to that of the relatively wide end portions 48b of the electrode portion 48. These stainless steel sheets 42, 44 have the same thickness as the sheets 10a, 10b of FIGS. 2(a) and 2(b), and the apertures 45 have the same width (at the wide central portions 45a) and the same spacing pitch as the apertures 5 of the sheets 10a, 10b. The thickness of the thin-walled portions 46 is one half of the thickness of the electrode portions 48. The two stainless steel sheets 42, 44 are superposed on each other such that the wide end portions 48b of the electrode portions are snugly fitted in the corresponding narrow end portions 45b of the apertures 45, whereby an electrode assembly 50 as shown in FIG. 8(e) is prepared. The electrode assembly 50 is processed in the same manner as described above, to produce the recording head as shown in FIG. 1 or 9.

Since the narrow end portions 45b of the apertures 45 and the wide end portions 48b of the electrode portions 48 of the stainless sheets 42, 44 have the substantially same width, the two sheets 42, 44 can be accurately positioned relative to each other by means of the engagement of the end portions 48b with the corresponding end portions 45b.

It will be understood from the foregoing description that the illustrated embodiments provide an array of recording electrodes which have a thickness larger than their spacing distance, and which are accurately dimensioned and positioned relative to each other, with a relatively high degree of density per unit distance along the direction of width.

By reference to FIG. 10 corresponding to that of FIG. 1, there will be described the relationship between the electrodes of the recording head of FIG. 10, and the apertures 5 (45) formed through the two stainless steel sheets 10a, 10b (20a, 20b, 30, 34, 42, 44), by way of example. In FIG. 10, four successive electrodes are indicated at 2A, 2B, 2C and 2D. The electrodes 2A and 2C are formed from the electrode portions 5a (48a) of the stainless steel sheet 10a, while the electrodes 2B and 2D are formed from the electrode portions 5a of the other stainless steel sheet 10b. Described more specifically, the electrode 2A formed from the sheet 10a, for example, has opposed etched faces 2a and 2a′ which are opposed to the two adjacent electrodes 2B and 2D formed from the other sheet 10b. As is apparent from the foregoing description, each face of each electrode is defined by the corresponding side edge of the corresponding aperture 5 (45) which is formed by etching through the stainless sheet from which the relevant electrode is formed. For instance, the face 2a of the electrode 2A has a shape which is characteristic of etching of the aperture 5 (45) formed in the sheet 10a, which aperture 5 has the width "d" indicated in FIG. 10. The width "d" is equal to the spacing between the face 2a, and a nearer face 2c′ of the electrode 2C which is located next beyond the electrode 2B immediately opposite to the face 2a, and which is formed from the sheet 10a from which the electrode 2A is formed. Namely, the electrode 2B formed from the sheet 10b is located intermediate between the faces 2a and 2c′ of the electrodes 2A and 2C which are formed from the sheet 10a and which are spaced from each other by a distance equal to the width "d" of the etched aperture 5 formed through the sheet 10a.

The electrodes may be used for a high-speed recording head for high-quality recording, such that the electrodes are held in good electrical contact with a print ribbon or film, or a recording medium such as a paper which produces a color due to electric discharge destruction or removal of a material from a recording medium, or due to exposure of a heat-sensitive recording medium to heat generated by application of an electric current.

For the same reasons described above, the recording electrodes obtained according to the present invention may be equally suitably used for a high-speed electrostatic recording head capable of printing with excellent image quality, on an electrostatically recordable medium or by using a dielectric drum.

What is claimed is:

1. A recording head operable to apply an electric current, comprising an array of recording electrodes in the form of strips which are substantially equally or regularly spaced apart from each other in a direction perpendicular to lengths of the strips, by a distance smaller than a thickness of said strips, such that said strips lie in substantially the same plane parallel to said direction, said strips consisting of at least parts of generally elongate electrode portions of a plurality of electrically conductive sheets superposed on each other in a predetermined relative position into an electrode assembly, said elongate electrode portions of each of said electrically conductive sheets being defined by a plurality of apertures whose width is larger than a thickness of said each electrically conductive sheet, said elongate electrode portions of said plurality of electrically conductive sheets cooperating with each other to define a plurality of slits whose width is smaller than said thickness of said each electrically conductive sheet, said electrode portions of said electrode assembly as said strips being spaced apart from each other by the width of said plurality of slits.

2. A recording head according to claim 1, wherein said electrode assembly consists of two electrically conductive sheets.

3. A recording head according to claim 1, wherein at least one of said plurality of electrically conductive sheets has a plurality of thin-walled portions at which said sheets are superposed on each other in said predetermined relative position.

4. A recording head according to claim 3, wherein said thin-walled portions of one of said electrically conductive sheets are in contact with the thin-walled portions of the other electrically conductive sheets.

5. A recording head according to claim 4, wherein a total thickness of said thin-walled portions of said electrically conductive sheets which are superposed on each other is substantially equal to said thickness of said each electrically conductive sheet.

6. A recording head according to claim 3, wherein said thin-walled portions provided on the same electrically conductive sheet have different thicknesses.

7. A recording head according to claim 1, wherein each of said electrode portions has a relatively narrow central portion and relatively wide end portions, while each of said apertures has a relatively wide portion and relatively narrow end portions, said relatively wide end portions of said each electrode portion has the same width as said relatively narrow end portions of said each aperture.

8. A recording head according to claim 1, wherein each of said plurality of electrically conductive sheets is formed of a stainless steel.

9. A recording head according to claim 1, further comprising a substrate on which said array of recording electrodes is fixedly provided.

10. A recording head according to claim 9, wherein said array of recording electrodes is bonded to said substrate by an adhesive material.

11. A recording head comprising an array of generally elongate recording electrodes which are substantially equally spaced apart from each other in a direction perpendicular to lengths of the electrodes, such that said recording electrodes lie in substantially the same plane parallel to said direction, each of said recording electrodes having etched faces which are opposed to the two adjacent electrodes, each of said etched faces of each said electrode having a shape which is characteristic to etching of an aperture having a width equal to a spacing between said each etched face, and the nearer etched face of the electrode which is located next beyond the electrode immediately opposed to said each etched face.

12. A recording head according to claim 11, wherein said aperture is etched through one of two electrically conductive sheets from which said each electrode and said electrode having said nearer etched face are formed, said electrode immediately opposed to said each etched face being formed from the other of said two electrically conductive sheets which has two adjacent apertures which are etched therethrough so as to define the etched faces of said electrode immediately opposed to said each etched face, each of said two adjacent apertures having said width.

13. A recording head according to claim 12, wherein said two electrically conductive sheets are superposed on each other into an electrode assembly, each of said two electrically conductive sheets having a plurality of generally elongate electrode portions which are substantially equally spaced from each other by said apertures, by a distance equal to said width, said recording electrodes consisting of at least parts of said electrode portions of said two electrically conductive sheets, said two conductive sheets being positioned relative to each other such that each of said electrode portions of said one electrically conductive sheet is located intermediate between the opposite ends of a corresponding one of said apertures formed in said other electrically conductive sheet.

* * * * *